United States Patent
Tseng et al.

(10) Patent No.: US 8,624,279 B2
(45) Date of Patent: Jan. 7, 2014

(54) LIGHT EMITTING DIODE SUBSTRATE AND LIGHT EMITTING DIODE

(75) Inventors: Bo-Hsiang Tseng, Hsinchu (TW); Yi-Shan Hsieh, Hsinchu (TW); Bo-Wen Lin, Hsinchu (TW); Kun-Lin Yang, Hsinchu (TW); Chun-Yen Peng, Hsinchu (TW); Wen-Ching Hsu, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 0 days.

(21) Appl. No.: 13/472,480

(22) Filed: May 16, 2012

(65) Prior Publication Data

US 2012/0305965 A1 Dec. 6, 2012

(30) Foreign Application Priority Data

Jun. 2, 2011 (TW) .............................. 100210043 U
Jul. 27, 2011 (TW) .............................. 100213825 U

(51) Int. Cl.
*H01L 33/00* (2010.01)
*H01L 27/15* (2006.01)
*H01L 29/16* (2006.01)
*H01L 31/12* (2006.01)
*H01L 29/18* (2006.01)

(52) U.S. Cl.
USPC .................. 257/95; 257/82; 257/88; 257/103

(58) Field of Classification Search
USPC ...................................... 257/73–109
See application file for complete search history.

(56) References Cited

U.S. PATENT DOCUMENTS

2007/0085093 A1* 4/2007 Ohmae et al. ................... 257/89

* cited by examiner

*Primary Examiner* — Steven Loke
*Assistant Examiner* — Juanita B Rhodes
(74) *Attorney, Agent, or Firm* — Jianq Chyun IP Office

(57) ABSTRACT

A light emitting diode (LED) substrate includes a sapphire substrate which is characterized by having a surface consisting of irregular hexagonal pyramid structures, wherein a pitch of the irregular hexagonal pyramid structure is less than 10 μm. A symmetrical cross-sectional plane of each of the irregular hexagonal pyramid structures has a first base angle and a second base angle, wherein the second base angle is larger than the first base angle, and the second base angle is 50° to 70°. This LED substrate has high light-emitting efficiency.

20 Claims, 9 Drawing Sheets

LIGHT EMITTING DIODE SUBSTRATE AND LIGHT EMITTING DIODE

CROSS-REFERENCE TO RELATED APPLICATION

This application claims the priority benefits of Taiwan application serial no. 100210043, filed on Jun. 2, 2011, and Taiwan application serial no. 100213825, filed on Jul. 27, 2011. The entirety of each of the above-mentioned patent applications is hereby incorporated by reference herein and made a part of specification.

TECHNICAL FIELD

The invention relates to a light emitting diode (LED) substrate, more particularly to an LED substrate with high light extraction efficiency and an LED using the same.

BACKGROUND

A light emitting diode (LED) is a light-emitting device fabricated with a compound semiconductor, in which electric energy is converted into light through the combination of electrons and holes. An LED is a type of cold light source, and has the advantages of low power consumption, no warm up time, long service life, and fast response speed, etc. It also provides the features of small size, high impact resistance, and is suitable for mass production. Consequently, a light emitting diode is readily attuned to meet the application requirements in fabricating extremely small or array devices.

In order to expand the application range of an LED in the future, the current research focuses on improving the light-emitting brightness of the LED. In an ideal LED, after the carriers in an active region are recombined into photons and all of these photons propagate to the external environment, the light emitting efficiency of such an LED is 100%. However, not 100% of the photons generated in the active region cannot be propagated to the external environment due to various depletion mechanisms.

In order to improve the light-emitting efficiency of an LED, a patterned LED substrate, for example, an LED substrate constituted with a plurality of cones or platform structures is used to scatter the light emitted from the LED, so as to reduce the total reflection.

SUMMARY

An exemplary embodiment of the invention provides a light emitting diode substrate having high light extraction efficiency.

An exemplary embodiment of the invention provides a light emitting diode having the above light emitting diode substrate.

An exemplary embodiment of the invention provides a light emitting diode substrate including a sapphire substrate, which is characterized by having a surface constructed with a plurality of irregular hexagonal pyramid structures, and a pitch of these irregular hexagonal pyramid structures is less than 10 µm. A symmetrical cross-sectional plane of the hexagonal pyramid structure has a first base angle and a second base angle, wherein the second base angle is greater than the first base angle, and the second base angle is between 50 to 70 degrees.

According to an exemplary embodiment of the invention, the pitch is between about 0.1 µm to 3 µm.

According to an exemplary embodiment of the invention, a maximum height of each irregular hexagonal pyramid structure is between 1 µm to 2 µm.

According to an exemplary embodiment of the invention, the top part of each irregular hexagonal pyramid structure is a plane or a pointed tip.

According to an exemplary embodiment of the invention, the above surface of the sapphire substrate includes a (0001) surface, and the (0001) surface is about 10% to 60% of a projected area of the surface.

Another exemplary embodiment of the invention provides a light emitting diode substrate including a sapphire substrate which is characterized by having a surface constructed with a plurality of pyramid structures, and each of the pyramid structures has a bottom surface with a plurality of acute angles. Each of the acute angles in one pyramid structure is close to the acute angles in adjacent pyramid structures.

According to another exemplary embodiment of the invention, the above surface of the sapphire substrate includes a (0001) surface, and the (0001) surface is about 5% to 40% of a projected area of the surface.

According to another exemplary embodiment of the invention, the pyramid structures includes trigonal pyramid or hexagonal pyramid.

According to another exemplary embodiment of the invention, a maximum height of each pyramid structure is between 1.5 µm to 2 µm.

According to another exemplary embodiment of the invention, the top of each pyramid structure is a plane or a pointed tip.

According to another exemplary embodiment of the invention, when the top part of each pyramid structure is a plane, a cover layer is disposed on the plane of each pyramid structure, and a material of the cover layer includes oxide, nitride or silicon.

An exemplary embodiment of the invention further provides a light emitting diode, which includes one of the above sapphire substrates, a first semiconductor layer disposed on the above sapphire substrate, a light emitting layer disposed on the above semiconductor layer, a second semiconductor layer disposed on the above light emitting layer, a first ohmic layer in contact with the first semiconductor layer, and a second ohmic layer in contact with the second semiconductor layer.

According to the exemplary embodiments of the invention, a sapphire substrate, constructed with a plurality of irregular hexagonal pyramid structures, serves as a light-emitting surface. Light diffusion is increased based on the 6 faces of the irregular hexagonal pyramid structures and light emitting efficiency of the substrate is enhanced. In addition, the arrangement of the pyramid structures may be defined to properly increase the area of the (0001) surface, and thus the exposed areas in said surface will be collected appropriately. Accordingly, it may reduce the difficulty in subsequent epitaxy process.

The invention and certain merits provided by the invention can be better understood by way of the following exemplary embodiments and the accompanying drawings, which are not to be construed as limiting the scope of the invention.

DETAILED DESCRIPTION OF DISCLOSED EMBODIMENTS

Figure 1:
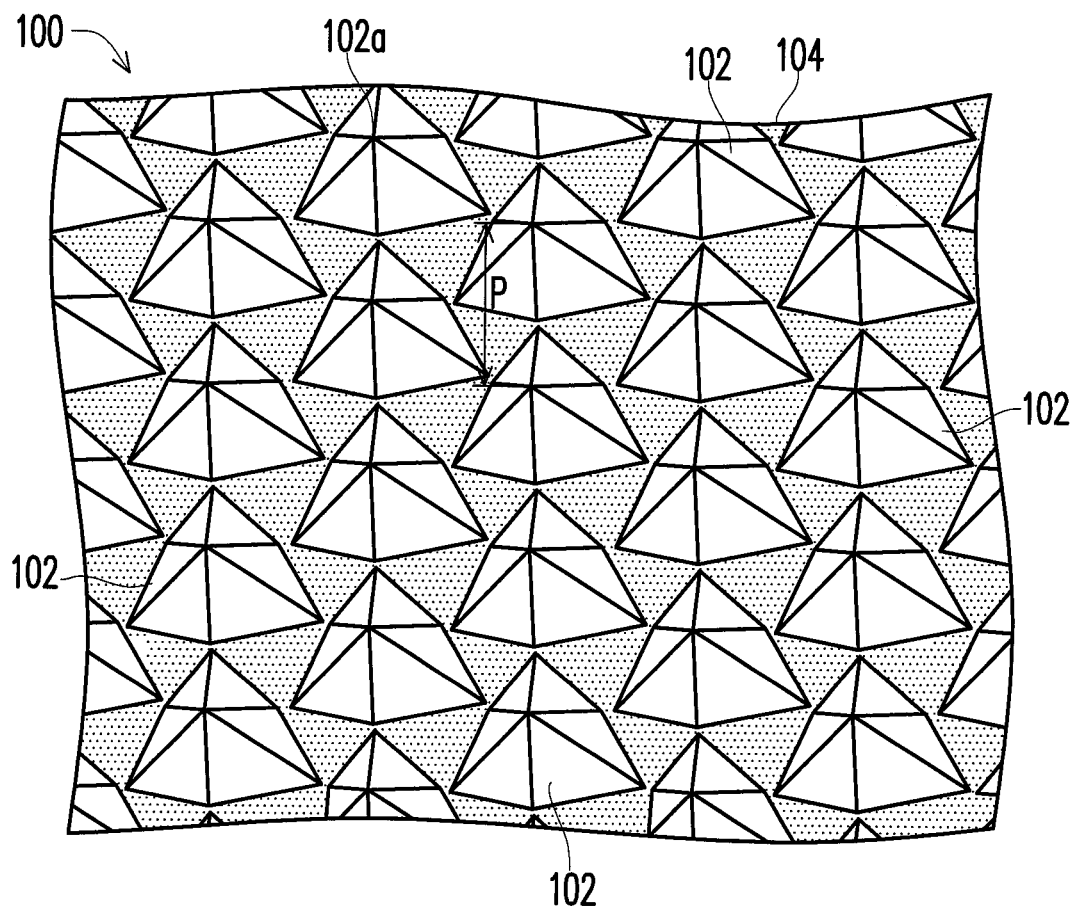
FIG. 1 is a three-dimensional view of a light emitting diode (LED) substrate according to a first embodiment of the invention.

FIG. 1 is a three-dimensional view of a light emitting diode (LED) substrate according to a first embodiment of the invention. As shown in FIG. 1, a sapphire substrate 100 is provided. The sapphire substrate 100 has a surface 104 constructed with a plurality of irregular hexagonal pyramid structures 102. The irregular hexagonal pyramid structure of the exemplary embodiment of the invention refers to a structure having six lateral faces erected from an irregular hexagon base with three acute portions and three obtuse portions, and the six lateral faces are at the same family of planes. A pitch P of these irregular hexagonal pyramid structures 102 is less than 10 µm. In one exemplary embodiment, the pitch is between 0.1 µm and 3 µm. The so-called "pitch" refers to a distance between two adjacent irregular hexagonal pyramid structures 102.

The symmetrical cross-sectional plane of an irregular hexagonal pyramid structure 200 includes a first base angle a1 and a second base angle a2, wherein the second base angle a2 is greater than the first base angle a1. The second base angle a2 is between 50 to 70 degrees. In one exemplary embodiment, it is between about 55 to 65 degrees.

In this exemplary embodiment, the top part 102a of the irregular hexagonal pyramid structure 102 is a pointed tip. It is understood by a person of ordinary skill practicing this invention that these examples in the disclosure are not intended to restrict the scope of this invention. The top part 102a may be a platform surface or a plane. The surface 104 of the sapphire substrate 100 includes a (0001) surface (the face depicted with dots in FIG. 1), and an area of the (0001) surface is about 10% to 60% of a projected area of the surface 104. In one exemplary embodiment, an area of the (0001) surface is about 10% to 30% of a projected area of the surface 104. When the area of the (0001) surface is more than 60% of the projected area of the surface 104, a gain of the light emitting efficiency is probably low; though when the area of the (0001) surface is less than 10% of the projected area of the surface 104, it may cause difficulties in epitaxy.

Figure 2A:
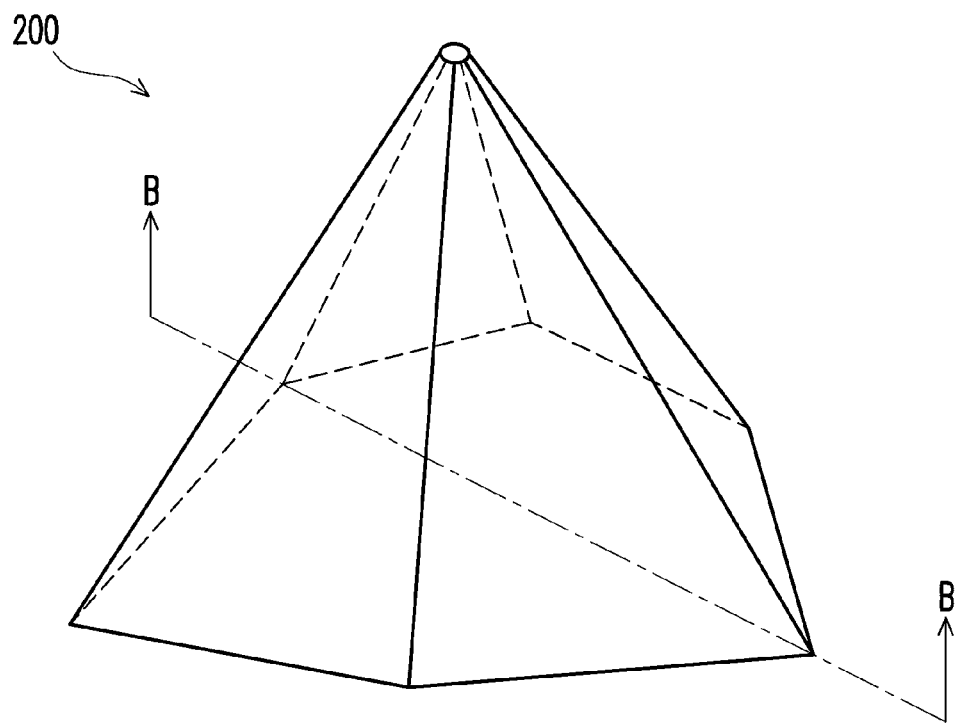
FIG. 2A is a three-dimensional view diagram of a single irregular hexagonal pyramid structure according to the first exemplary embodiment of the invention.
Figure 2B:
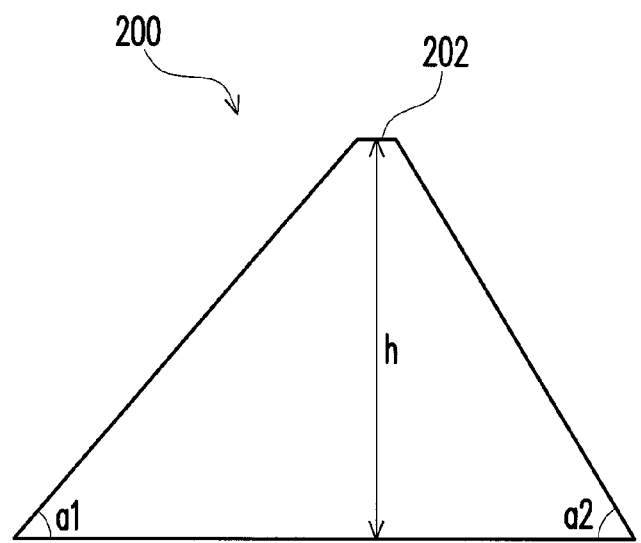
FIG. 2B is a symmetrical cross-section plane of the irregular hexagonal pyramid in FIG. 2A (the cross-section along the cutting line B-B).

FIG. 2A is a three-dimensional view diagram of a single irregular hexagonal pyramid structure according to a first exemplary embodiment of the invention. FIG. 2B is a symmetrical cross-section plane of the irregular hexagonal pyramid in FIG. 2A (the cross-section along the cutting line B-B).

Referring to FIGS. 2A and 2B, the maximum height h of the irregular hexagonal pyramid structure 200 is, for example, directly proportional to the pitch of the irregular hexagonal pyramid 200. The so-called "maximum height" refers to a distance between the top part 202 and the base of the irregular hexagonal pyramid structure 200. In one exemplary embodiment, the maximum height of the irregular hexagonal pyramid structure 200 is between about 1 µm to 2 µm. In one exemplary embodiment, the maximum height is between about 1.5 µm to 2 µm. When the maximum height of the irregular hexagonal pyramid structure 200 is greater than 2 µm, epitaxy is difficult. The top part 202 irregular hexagonal pyramid structure in FIGS. 2A and 2B is a plane.

The experimental examples of the manufacturing method of a light emitting diode substrate of the first exemplary embodiment are provided in the following disclosure. Referring to FIGS. 3A to 3D, wherein FIGS. 3A to 3D are cross-sectional view diagrams illustrating a fabrication flow of an LED substrate according to an exemplary embodiment of the invention.

Figure 3A:
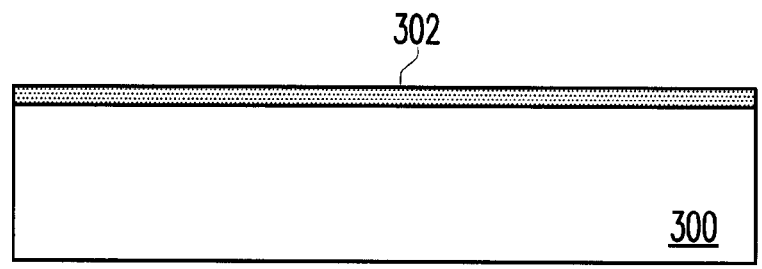
FIGS. 3A to 3D are cross-sectional view diagrams illustrating a fabrication flow of an LED substrate of the first exemplary embodiment of the invention.

A sapphire substrate 300 is provided, and an oxide layer 302 is deposited on the sapphire substrate 300, as shown in FIG. 3A.

Figure 3B:
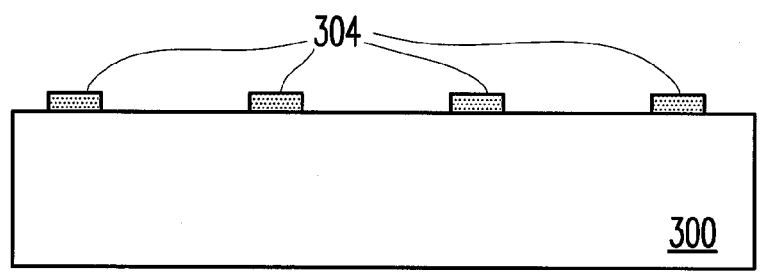

Thereafter, a hark mask 304 with a pattern is formed by performing photolithograph and etching on the oxide layer 302, as shown in FIG. 3B. If necessary, the adhesion between the hard mask 302 and the sapphire substrate 300 may be enhanced through the existing techniques, so as to increase its etching resistance capability in the subsequent etching process.

Figure 3C:
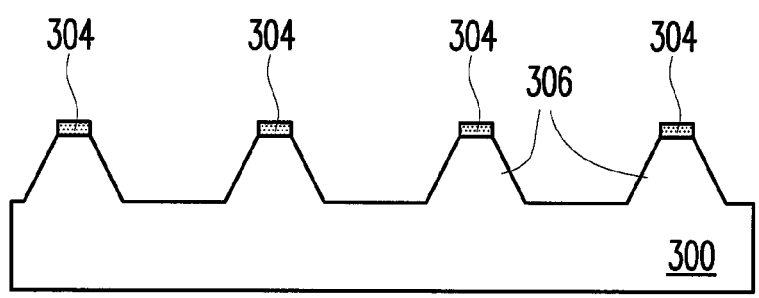

Several minutes of wet etching is performed, and during which, protrusion patterns 306 of an array of irregular hexagonal pyramid structures are formed on the sapphire substrate 300. Concurrently, the hard mask 304 gradually becomes smaller due to etching of the etching solution, as shown in FIG. 3C.

Figure 3D:
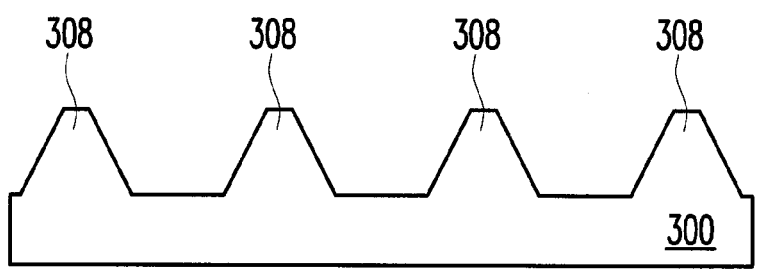

Ultimately, when the irregular hexagonal pyramid structures 308 are completely formed, and some of the hard mask 304 remains, an hard mask removing step is performed. If, as shown in FIG. 3D, no hard mask 304 remains, the etching process may stop. The irregular hexagonal pyramid structures 308 have a pitch of about 3 µm.

Experimental examples of the manufacturing method of an LED substrate of the invention as described above should not be construed as limited to the embodiments set forth herein. It should be appreciated that variations may be made in the embodiments described by persons skilled in the art without departing from the scope of the present invention as defined by the following claims.

Figure 4:
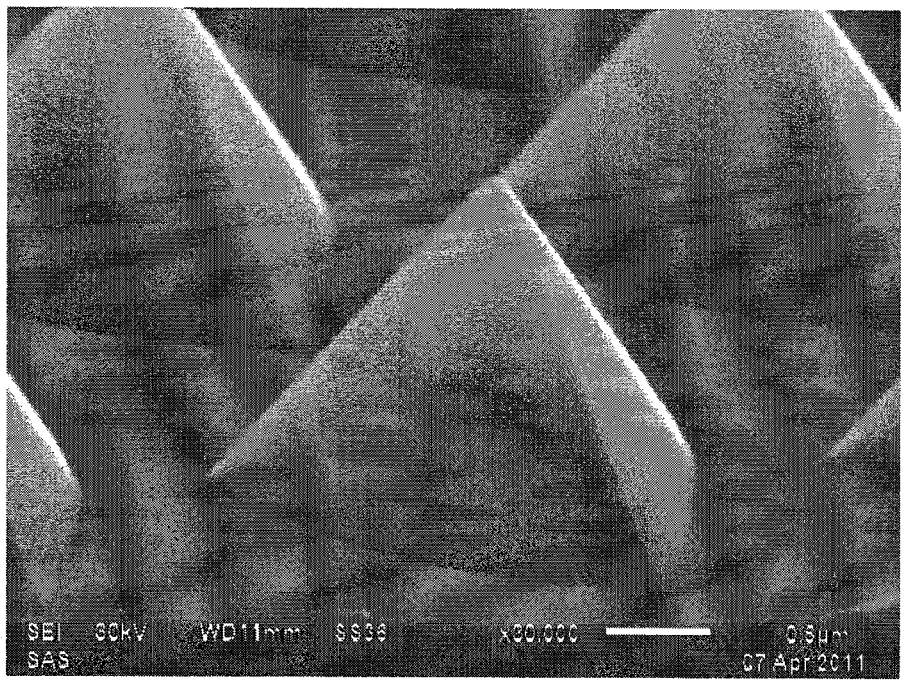
FIG. 4 is a scanning electron microscope (SEM) picture of a sapphire substrate fabricated according to the above exemplary embodiment.
Figure 5A:
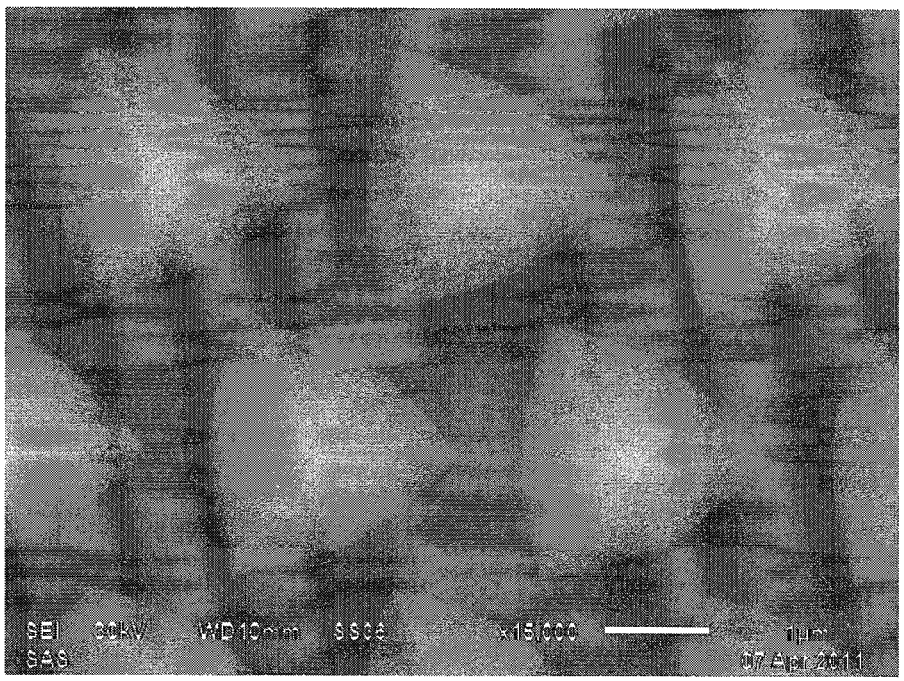
FIGS. 5A and 5B are respectively the top view and cross-sectional view SEM pictures of the LED substrate of FIG. 4.
Figure 5B:
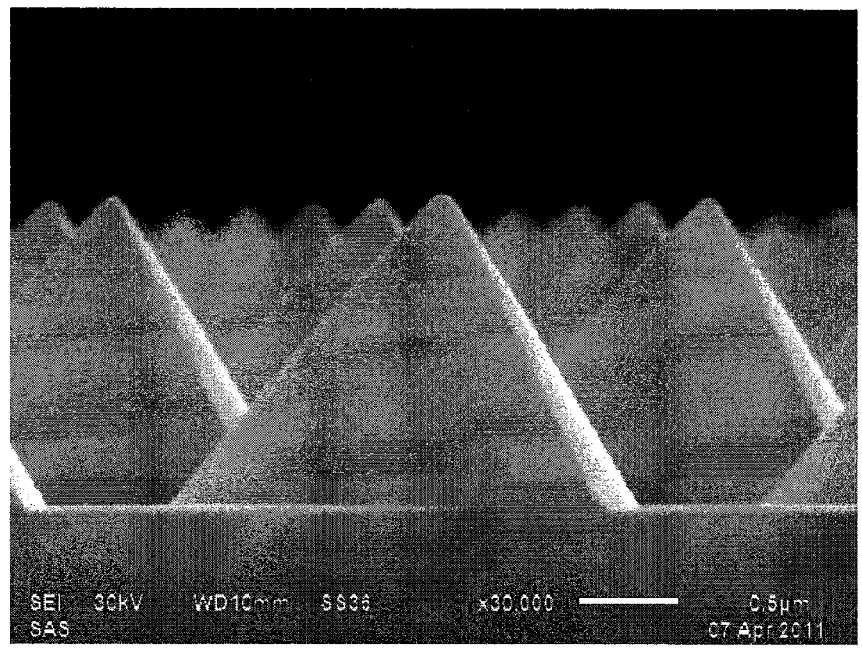

FIG. 4 is a scanning electron microscope (SEM) picture of a sapphire substrate fabricated according to the above exemplary embodiment; FIGS. 5A and 5B are respectively the top view and cross-sectional view SEM pictures of the LED substrate of FIG. 4. According to FIG. 5A, the irregular hexagonal pyramid structures are clearly observed.

Figure 6:
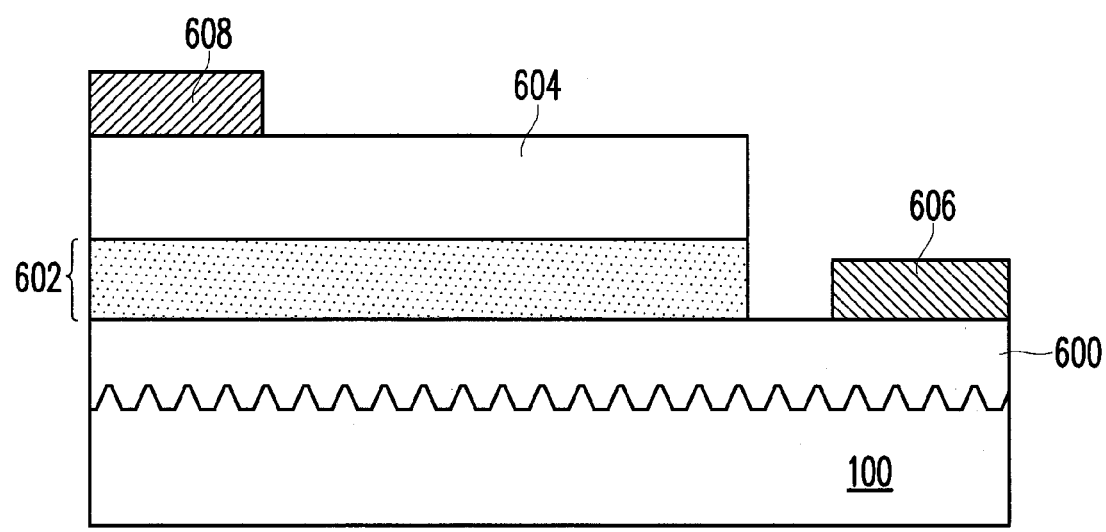
FIG. 6 is a schematic, cross-sectional view of a light emitting diode according to a second exemplary embodiment of the invention.

FIG. 6 is a schematic, cross-sectional view of a light emitting diode according to a second exemplary embodiment of the invention. As shown in FIG. 6, a sapphire substrate 100 (refer to FIG. 1), similar to the one in first exemplary embodiment, is provided. A first semiconductor layer 600 is disposed on the sapphire substrate 100, a light emitting layer 602 is disposed on the first semiconductor layer 600, and a second semiconductor layer 604 is disposed on the light emitting layer 602. A first ohmic electrode 606 is in contact with the first semiconductor layer 600, while the second ohmic electrode 608 is in contact with the second semiconductor layer 604. In this exemplary embodiment, the first semiconductor layer 600, the light emitting layer 602 and the second semiconductor layer 604 are respectively Groups III-V semiconductors, such as the gallium nitride semiconductor. The first ohmic electrode 606 and the second ohmic electrode 608 respectively include an alloy or a multi-layer film formed with, for example, at least one of nickel (Ni), lead (Pb), cobalt (Co), iron (Fe), titanium (Ti), copper (Cu), rhodium (Ru), gold (Au), ruthenium (Ru), tungsten (W), zirconium (Zr), molybdenum (Mo), tantalum (Ta), silver (Ag), an oxide of the above metals, and a nitride of the above metals. The first ohmic electrode 606 and the second ohmic electrode 608 may also include an alloy or a multi-layer film formed with rhodium (Rh), iridium (Ir), silver (Ag), or aluminum (Al).

To verify the effect of the LED substrate of the above exemplary embodiment, light emitting efficiencies of the LED in FIG. 6 using different LED substrates are simulated.

Simulation Test

Figure 7:
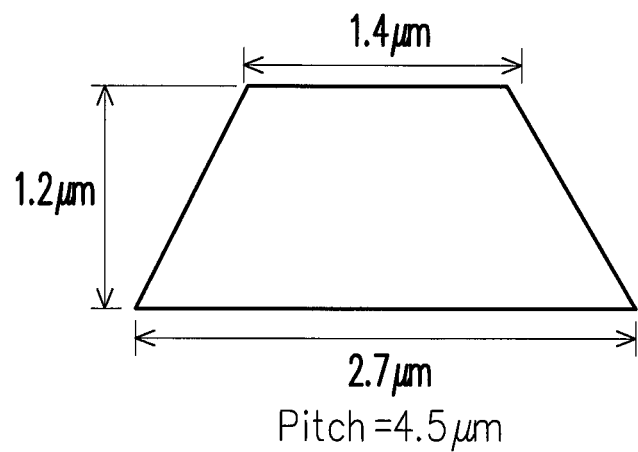
FIG. 7 illustrates the detailed dimension of a substrate including the conventional platform structures in the simulation test.

Assuming the first semiconductor layer 600 is n-GaN, the light emitting layer 602 is a multiple quantum well (MQW) structure, and the second semiconductor layer 604 is p-GaN. Two types of the LED substrates, which include a substrate consisted of the conventional platform structures of FIG. 7 and the substrate consisted of the irregular hexagonal pyramid structures of the first embodiment (referring to FIG. 8), are provided. The surface structures of the LED substrate shown in the above FIG. 7 are all fabricated through a dry etching process.

Figure 8:
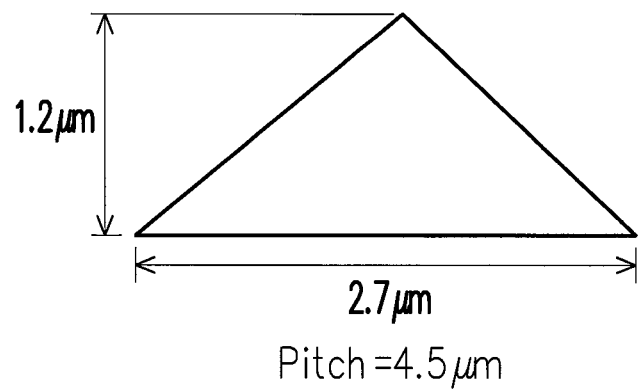
FIG. 8 illustrates the detailed dimension of a substrate including the irregular hexagonal pyramid structures in the simulation test.
Figure 9:
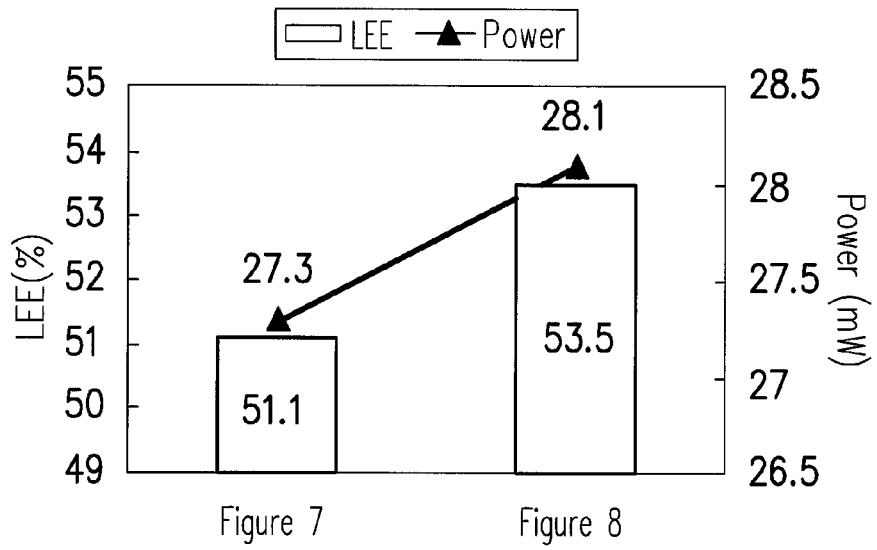
FIG. 9 is a diagram of a curve showing the results of the simulation test.

According to the simulation test results, as shown in FIG. 9, with respect to the light extraction efficiency (LEE) and light emitting efficiency, the substrate structure, as shown in FIG. 8 is superior to the conventional substrate with the platform structures.

Figure 10:
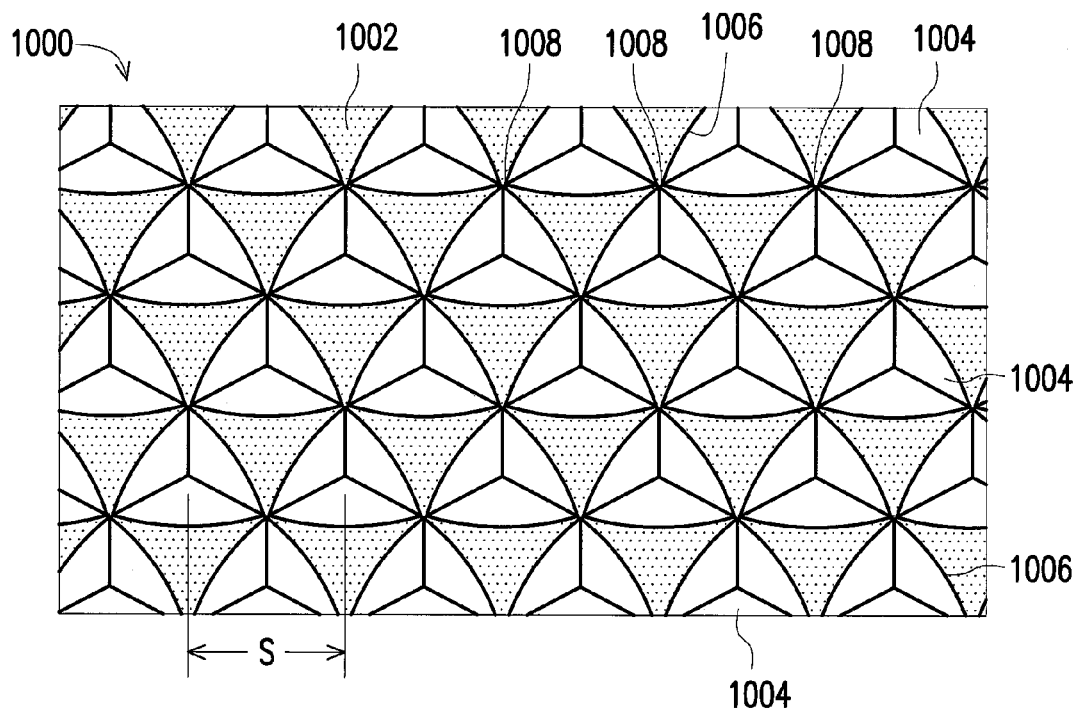
FIG. 10 is a three-dimensional view of a LED substrate according to a third embodiment of the invention.

FIG. 10 is a three-dimensional view of a LED substrate according to a third exemplary embodiment of the invention. As shown in FIG. 10, a sapphire substrate 1000 is provided. The sapphire substrate 1000 has a surface 1002 constructed with a plurality of pyramid structures 1004. Each of the pyramid structures 1004 has a bottom surface 1006 with a plurality of acute angles 1008. Each of the acute angles 1008 in one pyramid structure 1004 is close to one of the acute angles 1008 in adjacent pyramid structures 1004. The bottom surface 1006 of each pyramid structures 1004 is polygonal. For example, in FIG. 10, each bottom surface 1006 has three acute angles 1008 and the outline between two acute angles 1008 is a curve.

The surface 1002 of the sapphire substrate 1000 includes a (0001) surface (the face depicted with dots in FIG. 10). When the acute angles 1008 in one pyramid structure 1004 is close to one of the acute angles 1008 in adjacent pyramid structures 1004, an area of the (0001) surface may be increased. For example, the distance between one acute angle 1008 and another acute angle 1008 of adjacent pyramid structures 1004 is equal to or less than pitch S, or these two acute angles 1008 are connected each other. The so-called "pitch" refers to a distance between two adjacent pyramid structures 1004. An area of the (0001) surface is about 5% to 40% of a projected area of the surface 1002, and is preferably 10% to 30%. When the area of the (0001) surface is more than 40% of the projected area of the surface 1002, a gain of the light emitting efficiency is probably low. In addition, the top of the pyramid structure 1004 is a pointed tip. It is understood by a person of ordinary skill practicing this invention that these examples in the disclosure are not intended to restrict the scope of this invention. The top of each of the pyramid structure 1004 may has a platform surface.

Referring to FIG. 10, the maximum height of the pyramid structure 1004 is between about 1 µm to 2 µm, and is preferably between about 1.5 µm to 2 µm. When the maximum height of the pyramid structure 1004 is greater than 2 µm, epitaxy is difficult. Moreover, the pitch may have influence on the maximum height of the pyramid structure 1004. For example, when the pitch is about 3 µm, the maximum height is preferably between 1.5 µm to 2 µm; when the pitch is about 1.5 µm, the maximum height is preferably between 0.8 µm to 1.5 µm. Accordingly, the less the pitch is, the lower the maximum height is.

Figure 11:
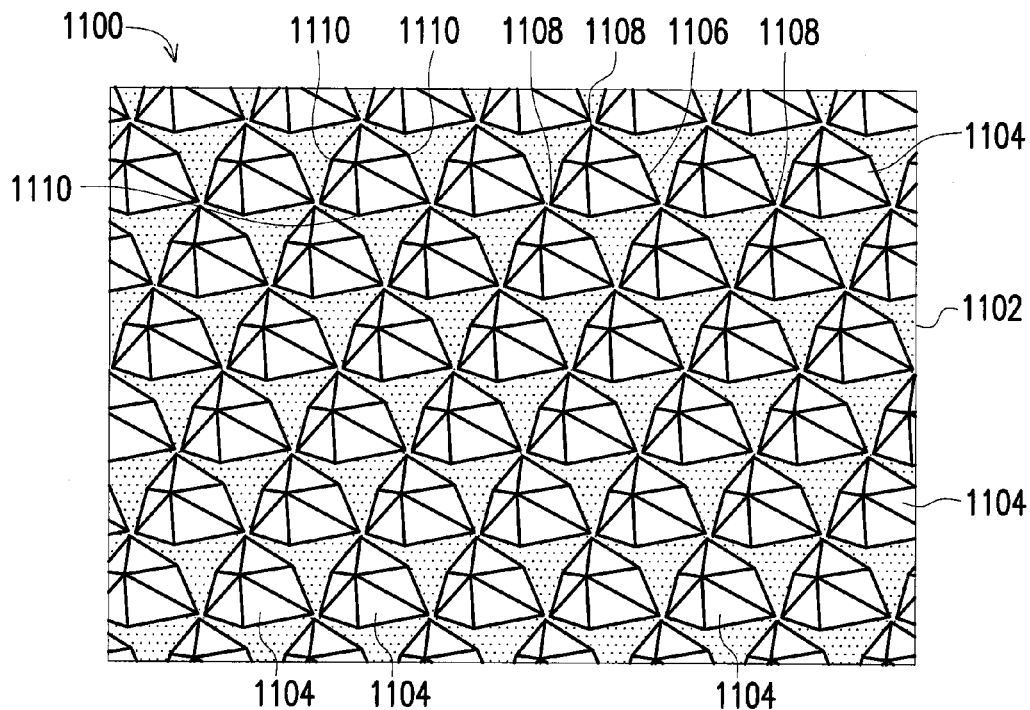
FIG. 11 is a three-dimensional view of a LED substrate according to a fourth embodiment of the invention.

FIG. 11 is a three-dimensional view of a LED substrate according to a fourth exemplary embodiment of the invention. As shown in FIG. 11, a sapphire substrate 1100 is provided. The sapphire substrate 1100 has a surface 1102 constructed with a plurality of irregular hexagonal pyramid structures 1104, and the irregular hexagonal pyramid structure 1104 is the same as the irregular hexagonal pyramid structure 102 in FIG. 1. Each of the irregular hexagonal pyramid structures 1104 has a hexagonal bottom surface 1006 including three acute angles 1108 and three obtuse angles 1110. Each of the acute angles 1108 in one irregular hexagonal pyramid structure 1104 is close to one of the acute angles 1108 in adjacent irregular hexagonal pyramid structure 1104. Area range of the (0001) surface and the maximum height both refer to the third embodiment.

Figure 12:
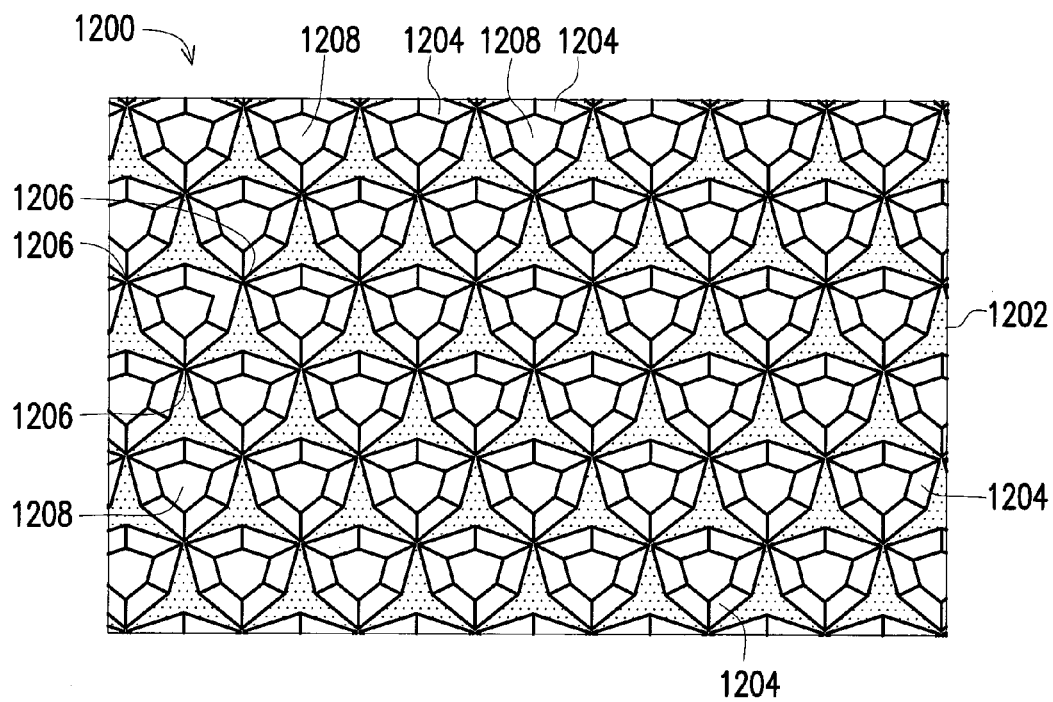
FIG. 12 is a three-dimensional view of a LED substrate according to a fifth embodiment of the invention.

FIG. 12 is a three-dimensional view of a LED substrate according to a fifth exemplary embodiment of the invention. As shown in FIG. 12, a sapphire substrate 1200 has a surface 1202 constructed with a plurality of irregular hexagonal pyramid structures 1204. Each of the acute angles 1206 in one irregular hexagonal pyramid structures 1204 is close to one of the acute angles 1206 in adjacent irregular hexagonal pyramid structure 1204. The difference between the fourth embodiment and this embodiment is the top of each of the irregular hexagonal pyramid structures 1204 is a plane 1208. Moreover, a cover layer (not shown) may be disposed on the plane 1208 of each pyramid structure 1204, wherein a material of the cover layer includes oxide, nitride or silicon, and for example, the material of the cover layer includes silicon oxide or silicon nitride. Furthermore, area range of the (0001) surface and the maximum height both refer to the third embodiment.

Figure 13:
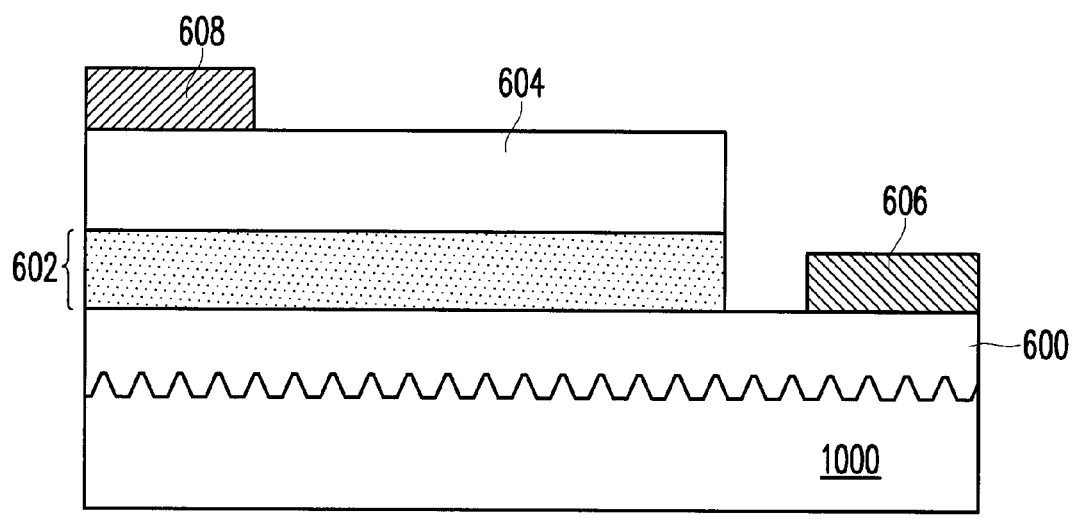
FIG. 13 is a schematic, cross-sectional view of a light emitting diode according to a sixth exemplary embodiment of the invention.

FIG. 13 is a schematic, cross-sectional view of a light emitting diode according to a sixth exemplary embodiment of the invention. As shown in FIG. 13, a sapphire substrate 1000 (refer to FIG. 10), similar to the one in the third exemplary embodiment, is provided. A first semiconductor layer 600, a light emitting layer 602, and a second semiconductor layer 604 are disposed on the sapphire substrate 1000. A first ohmic electrode 606 is in contact with the first semiconductor layer 600, while the second ohmic electrode 608 is in contact with the second semiconductor layer 604. In this exemplary embodiment, the first semiconductor layer 600, the light emitting layer 602, the second semiconductor layer 604, the first ohmic electrode 606 and the second ohmic electrode 608 are the same as the second exemplary embodiment.

According to the LED substrate of the invention, the sapphire substrate constructed with a plurality of the irregular hexagonal pyramid structures serves as a light emitting surface. Further, light scattering is enhanced by the six faces of the irregular hexagonal pyramid structures. Consequently, the light emitting efficiency of the LED using the LED substrate of the invention is improved. Besides, the pyramid structures may be arranged to properly increase the area of the (0001) surface, and thus it may reduce the difficulty in subsequent epitaxy process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode substrate, comprising:
a sapphire substrate, and a surface of the sapphire substrate comprises a plurality of irregular hexagonal pyramid structures, and a pitch of the plurality of irregular hexagonal pyramid structures being less than 10 μm, wherein a symmetrical cross-sectional plane of each of the irregular hexagonal pyramid structures comprises a first base angle and a second base angle, and the second base angle is greater than the first base angle, and the second base angle is between 50 to 70 degrees.

2. The light emitting diode substrate of claim 1, wherein the pitch is between about 0.1 μm to 3 μm.

3. The light emitting diode substrate of claim 1, wherein a maximum height of each of the irregular hexagonal pyramid structures is between 1 μm to 2 μm.

4. The light emitting diode substrate of claim 1, wherein a top part of each of the irregular hexagonal pyramid structures is a plane or a pointed tip.

5. The light emitting diode substrate of claim 1, wherein the surface includes a (0001) surface, and the (0001) surface is about 10% to 60% of a projected area of the surface.

6. A light emitting diode, comprising:
a sapphire substrate, comprising a surface constructed with a plurality of irregular hexagonal pyramid structures, and a pitch of the plurality of irregular hexagonal pyramid structures being less than 10 μm, wherein a symmetrical cross-sectional plane of each of the irregular hexagonal pyramid structures comprises a first base angle and a second base angle, and the second base angle is greater than the first base angle, and the second base angle is between 50 to 70 degrees;
a first semiconductor layer, disposed on the sapphire substrate;
a light emitting layer, disposed on the first semiconductor layer;
a second semiconductor layer, disposed on the light emitting layer;
a first ohmic electrode, in contact with the first semiconductor layer; and
a second ohmic electrode, in contact with the second semiconductor layer.

7. The light emitting diode of claim 6, wherein the pitch is between about 0.1 μm to 3 μm.

8. The light emitting diode of claim 6, wherein a maximum height of each of the irregular hexagonal pyramid structures is between 1 μm to 2 μm.

9. The light emitting diode of claim 6, wherein a top part of the each of the irregular hexagonal pyramid structures is a plane or a pointed tip.

10. The light emitting diode of claim 6, wherein the surface includes a (0001) surface, and the (0001) surface is about 10% to 60% of a projected area of the surface.

11. A light emitting diode substrate, comprising:
a sapphire substrate, and a surface of the sapphire substrate comprises a plurality of pyramid structures, wherein each of the pyramid structures has a bottom surface with a plurality of acute angles, and each of the pyramid structures is a tetrahedron,
each of the acute angles in one pyramid structure is close to the acute angles of adjacent pyramid structures.

12. The light emitting diode substrate of claim 11, wherein the surface of the sapphire substrate includes a (0001) surface, and the (0001) surface is about 5% to 40% of a projected area of the surface.

13. The light emitting diode substrate of claim 11, wherein a maximum height of each of the pyramid structures is between 1.5 μm to 2 μm.

14. The light emitting diode substrate of claim 11, wherein a top part of each of the pyramid structures is a pointed tip.

15. The light emitting diode substrate of claim 14, further comprising a cover layer disposed on the plane of each of the pyramid structures, wherein a material of the cover layer includes oxide, nitride or silicon.

16. A light emitting diode, comprising:
a sapphire substrate, comprising a surface constructed with a plurality of pyramid structures, and each of the pyramid structures has a bottom surface with a plurality of acute angles, each of the pyramid structures is a tetrahedron, and each of the acute angles in one pyramid structure is close to the acute angles of adjacent pyramid structures;
a first semiconductor layer, disposed on the sapphire substrate;
a light emitting layer, disposed on the first semiconductor layer;
a second semiconductor layer, disposed on the light emitting layer;
a first ohmic electrode, in contact with the first semiconductor layer; and
a second ohmic electrode, in contact with the second semiconductor layer.

17. The light emitting diode of claim 16, wherein the surface of the sapphire substrate includes a (0001) surface, and the (0001) surface is about 5% to 40% of a projected area of the surface.

18. The light emitting diode of claim 16, wherein a maximum height of each of the pyramid structures is between 1.5 μm to 2 μm.

19. The light emitting diode of claim 16, wherein a top part of each of the pyramid structures is a pointed tip.

20. The light emitting diode of claim 19, further comprising a cover layer disposed on the plane of each of the pyramid structures, wherein a material of the cover layer includes oxide, nitride or silicon.

* * * * *